Jan. 26, 1960 W. J. ENGEL 2,922,978

PRINTED WIRE SOCKET

Filed Oct. 29, 1956

Inventor
William J. Engel
by John Todd
Atty.

United States Patent Office 2,922,978

Patented Jan. 26, 1960

2,922,978

PRINTED WIRE SOCKET

William J. Engel, Chicago, Ill., assignor, by mesne assignments, to United-Carr Fastener Corporation, Boston, Mass., a corporation of Delaware Application October 29, 1956, Serial No. 618,769

8 Claims. (Cl. 339—17)

Figure 1:
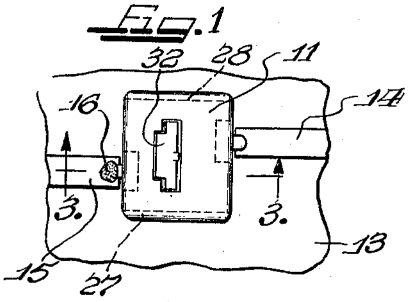

This invention relates to a socket structure, and more especially to a printed wire socket. The socket is particularly suited for use with printed wire boards or panels to provide a mounting thereon for a circuit component, such as a selenium rectifier, and electrically connect that component with a printed wire of the board or panel.

An object of this invention is to provide a socket structure adapted to serve as a mounting and contact member for mounting a circuit component upon a printed wire board or panel while providing a good electrical connection between such circuit component and a printed wire of the board. Another object is that of providing a mounting and contact member in the character of a printed wire socket that is quickly and easily mounted upon a printed wire board, and that also serves to quickly and easily mount a circuit component on the board and connect the same in the electrical circuitry thereof.

Still another object is in the provision of a printed wire socket that is mountable within an opening provided therefor in a printed wire board by snapping the same into place within that opening. Yet another object is to provide a printed wire socket comprising a socket casting equipped with a contact strap constructed and arranged to electrically connect a circuit component mounted in the socket in the circuitry of a printed wire board, while at the same time functioning to mechanically mount the socket casting with respect to the board; such mechanical mounting being effectuated by a snap action locking the socket casting in position within an opening in the printed wire board, and resulting in an interlock between overhanging shoulders provided by the casting and hooks provided by the strap, and eared shoulders carried by the strap.

A further object of this invention is in the provision of a printed wire socket wherein a socket casting has a socket opening therein for receiving the contact terminal of a circuit component, and in which a contact strap is arranged within the socket opening for resiliently gripping the terminal of the circuit component to form a good electrical and mechanical connection therewith; the contact strap being constrained within the socket opening against movement in a downward direction, and extending outwardly therefrom as sheared tails drawn upwardly along opposite side walls of the casting and restricted and bent laterally at the terminal ends thereof to form hooks engageable with the upper surface of a printed wire panel and with certain of the wires thereon to aid in constraining the socket casting against downward movement thereof through a mounting opening therefor in the panel—the tails being eared outwardly a spaced distance below the hooked ends to form abutment shoulders engaging the under-surface of the board to constrain the socket casting against upward movement. Additional objects and advantages will become apparent as the specification develops.

An embodiment of the invention is illustrated in the accompanying drawing, in which—

Figure 2:
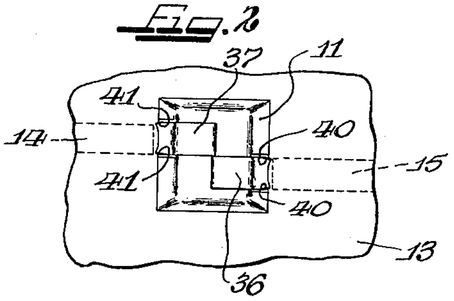
Figure 3:
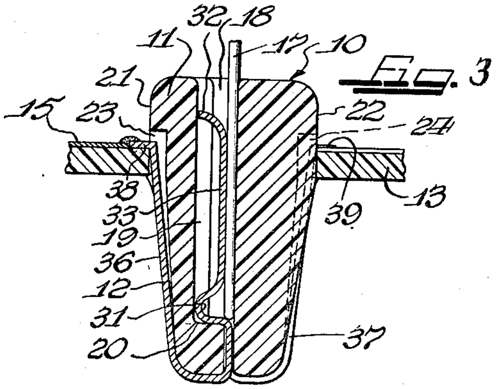
Figure 4:
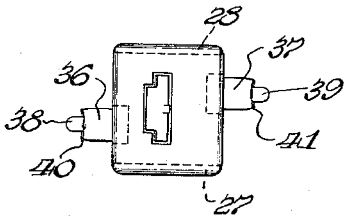
Figure 5:
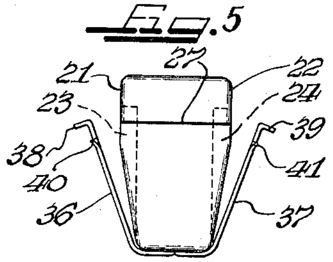
Figure 6:
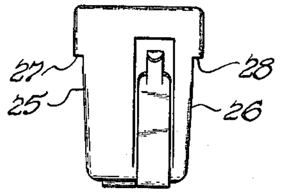
Figure 7:
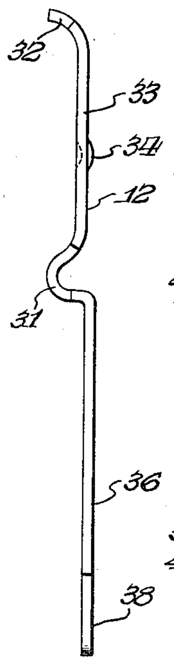
Figure 8:
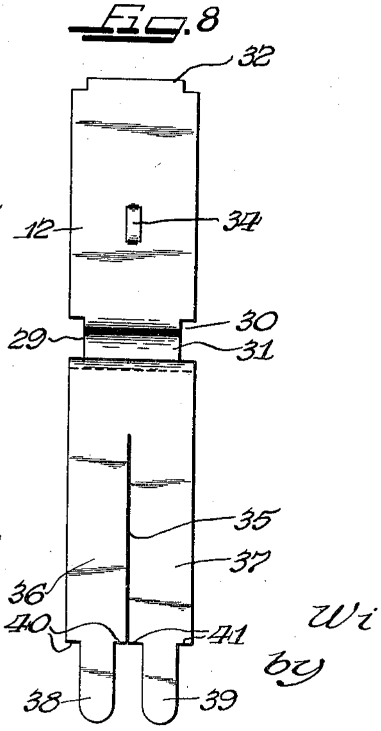

Figure 1 is a top plan view of a printed wire socket embodying the invention, shown mounted in a printed wire board; Figure 2 is a bottom plan view of the socket structure and printed wire board illustrated in Figure 1; Figure 3 is an enlarged vertical sectional view taken along the line 3—3 of Figure 1; Figure 4 is a top plan view of a socket casting embodying the invention, shown apart from a mounting connection thereof in a printed wire board; Figure 5 is a side view in elevation of the structure illustrated in Figure 4; Figure 6 is an end view in elevation of the structure illustrated in Figures 4 and 5; Figure 7 is a side view in elevation of a contact strap ready for insertion into a socket casting; and Figure 8 is a face or side view in elevation of the contact strap shown in Figure 7.

The printed wire socket illustrated in the drawing is designated in general with the numeral 10, and it comprises a socket casting 11 and a contact strap 12. The socket 10 is mounted within an opening provided therefor in a printed wire board or panel 13 having printed wires 14 and 15 thereon. The ends of the contact strap 12 are electrically connected to the printed wires 14 and 15 in a manner to be described more fully hereinafter by solder globules 16. The contact strap also electrically connects the terminal 17 of a circuit component (not shown), such as a selenium rectifier, with the printed wires of the board 13, and mechanically secures such circuit component in position with respect to the board 13 and the circuitry thereof.

The socket casting 11 is formed, as is well known, of an insulating material and is provided with a passage 18 that extends longitudinally therethrough and is enlarged throughout a substantial portion thereof to form a socket opening 19. An abutment shoulder or seat 20 is formed within the socket opening 19 at the lower end thereof, whereat it merges with the restricted passage 18. Along opposite side walls 21 and 22 of the casting 11 are formed recesses or channels 23 and 24, respectively. Opposed side walls 25 and 26 of the casting 11 are recessed inwardly throughout a substantial portion thereof so as to define overhanging shoulders or ledges 27 and 28, respectively, adapted to seat upon the upper surface of the board 13 when the socket is mounted in the opening thereof, as shown in Figures 1 through 3.

The contact strap 12 is substantially greater in length than the socket casting 11, and intermediate the ends thereof and adjacent the center portion it is notched to form recesses or openings 29 and 30 along opposite sides thereof that define a restricted portion 31 therebetween, curved or bowed outwardly to form a stop shouder engageable with the seat 20. The end of the contact strap 12 above the outwardly bowed stop shoulder 31 is turned or curved laterally, as shown at 32, in the same direction of the stop shoulder to form a resilient frictional gripper section 33 therebetween. The gripper section 33 is pressed outwardly in the central portion thereof to form a restricted locking dimple 34 adapted to be received within an opening provided therefor in the mounting terminal 17 of a circuit component.

Below the outwardly bowed stop shoulder 31, the contact strap is severed longitudinally along the line 35 to define sheared tails 36 and 37, each of which is restricted at its lower end to form tail ends 38 and 39, respectively. The tail ends 38 and 39 are adapted to be turned laterally to form hooks, as is shown in Figures 1 through 6. It will be most apparent from Figure 8 that the tails 36 and 37 each has a pair of shoulders 40 and 41, respectively, along opposite sides of the tail ends 38 and 39, and these shoulders are eared outwardly, as shown best in Figures 3 and 5, and form with the laterally turned hooked ends a snap lock therebetween.

All of the components heretofore described are formed separately, and per se the circuit component that provides the terminal 17 and the printed wire board 13 form no part of this invention. The board 13 is made of an insulating material, and the wires 14 and 15 may be formed thereon by conventional techniques. An opening therethrough will necessarily be provided, and it will be dimensioned for receiving the socket 10. Any circuit component may be mounted in the socket and electrically connected into the printed wire circuit so long as such component may be equipped with a terminal 17.

The socket casting 11 may be formed by any of the well known manufacturing techniques, and ordinarily will be a molded plastic product. The contact strap 12 is metal and it may be stamped from metal stock, and the curved end 32 and centrally bowed shoulder 31 may be formed therein as part of such stamping operation. However, formed, the contact strap will be provided in the form shown in Figures 8 and 7, for assembly with the casting 11. That is, the tail ends 38 and 39 and the associated shoulders 40 and 41 will be straight or, in other words, in planar alignment with the tails 36 and 37.

The casting 11 and strap 12 are then brought together and the strap is inserted into the passage 18 until the shoulder 31 is brought into engagement with the seat 20, as shown best in Figure 3. Thereafter, the tails 36 and 37 are bent in opposite directions, and are extended in a horizontal plane that would be generally parallel to the plane of the board 13, as it is shown in Figure 3. Then, the tail ends 38 and 39 are turned laterally, and the paired shoulders 40 and 41 are bent or eared outwardly and into the configuration shown best in Figures 3 and 5. The forming of the outwardly eared shoulders and the hooked ends may be accomplished in a pressing operation. Subsequently, the tails 36 and 37 are turned outwardly so as to extend generally along the side walls 21 and 22 of the casting, as shown in Figure 5. At this time, the printed wire socket is ready for mounting on a panel or board 13.

When the socket casting 11 has been equipped with the strap 12 and is in the assembled condition illustrated in Figures 4 through 6, it may be mounted in the opening formed in the panel 13 by pushing it downwardly through the opening. Such movement cams the tails 36 and 37 inwardly and into the recesses 23 and 24, and ultimately the downward movement brings the overhanging shoulders 27 and 28 of the casting into abutment with the upper side of the panel 13, and at this same time, the tail ends or hooks 38 and 39 engage the upper side of the panel (or, more particularly, the printed wires 14 and 15 thereon). It will be apparent that the tails 36 and 37 are dimensioned with respect to the hooked ends thereof so as to provide an aligned relation with the overhanging shoulders 27 and 28 that will afford this simultaneous engagement.

At the moment of this engagement, the outwardly eared shoulders 40 and 41 engage the under-surface of the panel 13, as shown in Figures 2 and 3, whereupon the casting 11 is unable to move upwardly with respect to the panel and it cannot move downwardly with respect thereto because of the engagement of the hooks 38 and 39 and of the overhanging shoulders 27 and 28 with the panel 13. Thus, the socket is rigidly constrained with respect to the board 13 and an electrical connection is provided between the printed wires 14 and 15 through the contact strap because of the solder connections thereof with the printed wires.

No strain is placed on the socket casting 11 or contact strap 12 when the terminal 17 of the circuit component is inserted into the casting socket 19, for the downward force appearing at the terminal 17 is transferred directly to the panel 13 through the shoulders 27 and 28 of the casting. Thus, there is no danger of cracking the solder connection between the printed wires and the hooks 38 and 39. When it is necessary to remove the terminal 17, upward force resulting from the withdrawal thereof is transferred directly to the panel 13 through the outwardly eared shoulders 40 and 41 so that no strain is placed on the solder connections. It will be noted, particularly by reference to Figure 3, that the outwardly turned end 32 and the outwardly bowed shoulder 31 are in substantially vertical alignment, and each engages an outside wall of the socket opening 19. Thus, the portion of the contact strap therebetween forms a resilient or spring gripper that frictionally engages the terminal 17 and tightly grips the same to afford both a good mechanical and good electrical connection therewith.

While in the foregoing specification an embodiment of the invention has been set forth in considerable detail for purposes of making an adequate disclosure thereof, it will be apparent to those skilled in the art that numerous changes may be made in those details without departing from the spirit and principles of the invention.

I claim:

1. In a socket structure of the character described adapted for mounting within an opening in a printed wire panel, a socket casting having a socket opening therein, a contact strap in said socket opening and having a severed portion defining tails extending outwardly therefrom, said tails being drawn across an end wall and reversely along opposite side walls of said casting, means for constraining movement of said strap with respect to said casting, and locking means at the outer end of each of said tails for anchoring the same to a printed wire panel when the socket is within an opening therefor provided in the panel.

2. In a socket structure of the character described, a socket casting adapted to be mounted within an opening therefor in a printed wire panel, said socket casting having a pair of opposite side walls provided with overhanging shoulders adapted to engage one side of such a panel to prevent movement of the socket in one direction when the casting is positioned within the opening thereof, a contact strap extending through said socket casting and having an outwardly extending end portion severed to define a pair of reversely drawn tails along the other pair of opposite side walls, and means to constrain said strap against movement with respect to said casting in the aforesaid one direction, said tails having abutments extending outwardly therefrom in engagement with the other side of such printed wire panel when the socket structure is mounted in the opening thereof to prevent movement of the casting in a direction opposite to that of the aforesaid one direction.

3. In a socket structure, a socket casting having an opening therethrough adapted to receive the terminal of a circuit component therein, a contact strap extending through said opening and outwardly therefrom, means within said opening for preventing movement of said strap therethrough in one direction, the outwardly extending portion of said strap providing a pair of tails reversely drawn along opposite side walls of said casting and being equipped with abutments extending outwardly therefrom spaced distances from the outer ends thereof, said outer ends being turned laterally to form hooks providing snap locks with the outwardly extending abutments, and a shoulder extending outwardly from each of the other side walls of said casting, whereby when the socket structure is inserted into an opening provided therefor in a printed wire panel, the outwardly extending shoulders on said side walls and said hooks engage said panel along one side thereof while the outwardly extending abutments on said tails engage the other surface of such panel to lock the socket in position thereon.

4. In a structure of the character described, a socket casting having an opening extending therethrough adapted to receive the terminal of a circuit component therein, said casting providing an abutment seat within said opening, a contact strap extending longitudinally in said opening and being equipped with a stop in engagement with said seat to prevent longitudinal movement of said contact strap in one direction with respect to said casting, said contact strap having a substantial portion extending outwardly from said casting and being severed longitudinally to define tails, said tails being bent in opposite directions and being reversely drawn along side walls of said casting and being effective to prevent longitudinal movement of the contact strap in a direction opposite to that of the aforesaid one direction, and means at the outer ends of said tails for connecting the same to printed wires of a printed wire panel to establish an electrical connection therewith for the terminal of the circuit component received within said opening and engaging that portion of said contact strap extending within said opening.

5. The structure of claim 4 in which said casting is provided with recesses extending longitudinally of said side walls for receiving the tails of said contact strap therein.

6. In combination, a socket casting having a pair of side walls equipped with overhanging shoulders adapted to engage a side of a panel having an opening receiving the casting therein to limit movement of the casting in one direction with respect to the panel, other opposite side walls of said casting each having a recess extending longitudinally thereof, a contact strap having a longitudinally severed end portion defining tails each equipped with a restricted tail end, said contact strap having intermediate the ends thereof an outwardly bowed portion defining a stop shoulder, said casting having a socket opening therein and said strap extending longitudinally in said opening with said tails extending outwardly from said casting and being bent outwardly in opposite directions and drawn upwardly in said recesses, said tail ends being turned laterally to engage printed wires on a panel when said casting is positioned within an opening in such panel provided therefor and with its overhanging shoulders in engagement with the surface thereof, whereby a circuit component having a terminal inserted into said socket opening is electrically connected with such printed wires through said contact strap.

7. A printed wire socket, comprising a socket casting having a passage extending therethrough enlarged throughout a portion thereof to define a socket opening, said passage at the point of merger with said socket opening having a stop seat therein, a contact strap extending through said passage and being equipped with a stop shoulder engaging said seat, said contact strap having a portion thereof extending outwardly from said passage and being severed to define tails turned respectively in opposite directions and drawn upwardly along the side walls of said casting, said casting having a pair of overhanging shoulders and the outer ends of said tails being turned laterally, whereby when the socket is inserted into the opening provided therefor in a printed wire board, said overhanging shoulders and said outwardly turned ends engage a surface of said panel to prevent movement of said socket therethrough.

8. In a printed wire socket structure, a socket casting having a passage extending therethrough enlarged throughout a substantial portion thereof to provide a socket opening adapted to receive the contact terminal of a circuit component therein and having a seat at the inner end thereof, a contact strap extending through said passage and having a stop shoulder engaging said seat and a laterally turned end in engagement with a wall of said socket opening and defining with said stop shoulder a resilient gripper therebetween for frictionally engaging a contact terminal received within said socket opening, said contact strap being slitted to form tails turned in opposite directions to extend along opposite sides of said socket casting, said tails having narrowed ends turned laterally to provide hooks and outwardly eared shoulders spaced therefrom, and overhanging shoulders provided by said socket casting in general alignment with said hooks but on opposite walls thereof.

References Cited in the file of this patent

UNITED STATES PATENTS

| | | |
|---|---|---|
| 2,699,534 | Klostermann | Jan. 11, 1955 |
| 2,776,415 | McGinley | Jan. 1, 1957 |

FOREIGN PATENTS

| | | |
|---|---|---|
| 592,686 | Great Britain | Sept. 25, 1947 |